United States Patent
Chen et al.

(10) Patent No.: US 11,423,593 B2
(45) Date of Patent: Aug. 23, 2022

(54) SYSTEMS AND METHODS FOR RECONSTRUCTING A MEDICAL IMAGE USING META LEARNING

(71) Applicant: SHANGHAI UNITED IMAGING INTELLIGENCE CO., LTD., Shanghai (CN)

(72) Inventors: Zhang Chen, Brookline, MA (US); Shanhui Sun, Lexington, MA (US); Terrence Chen, Lexington, MA (US)

(73) Assignee: Shanghai United Imaging Intelligence Co., Ltd., Shanghai (CN)

( * ) Notice: Subject to any disclaimer, the term of this patent is extended or adjusted under 35 U.S.C. 154(b) by 327 days.

(21) Appl. No.: 16/720,602

(22) Filed: Dec. 19, 2019

(65) Prior Publication Data

US 2021/0192808 A1  Jun. 24, 2021

(51) Int. Cl.
| | |
|---|---|
| *G06K 9/00* | (2022.01) |
| *G06T 11/00* | (2006.01) |
| *G06N 3/04* | (2006.01) |
| *G06N 3/08* | (2006.01) |
| *G06F 17/14* | (2006.01) |

(52) U.S. Cl.
CPC .......... *G06T 11/006* (2013.01); *G06N 3/0445* (2013.01); *G06N 3/08* (2013.01); *G06F 17/14* (2013.01); *G06T 2210/41* (2013.01); *G06T 2211/424* (2013.01)

(58) Field of Classification Search
CPC ............... G06T 11/006; G06T 2210/41; G06T 2211/424; G06T 17/00; G06N 3/0445; G06N 3/08; G06N 3/0454; G06F 17/14; G06F 17/11; G01R 33/5608
USPC .................................. 382/131; 324/307, 309
See application file for complete search history.

(56) References Cited

U.S. PATENT DOCUMENTS

| | | | | |
|---|---|---|---|---|
| 5,742,163 | A * | 4/1998 | Liu .................. | G01R 33/56554 324/307 |
| 10,657,646 | B2 * | 5/2020 | Lyu .................... | G01R 33/4824 |
| 2008/0310695 | A1 * | 12/2008 | Garnier ..................... | G06T 5/50 382/131 |
| 2020/0408864 | A1 * | 12/2020 | Mailhe ................... | G06N 3/088 |

* cited by examiner

*Primary Examiner* — Charlotte M Baker
(74) *Attorney, Agent, or Firm* — Faegre Drinker Biddle & Reath LLP

(57) ABSTRACT

Methods and systems for reconstructing an image. For example, a method includes: receiving k-space data; receiving a transform operator corresponding to the k-space data; determining a distribution representing information associated with one or more previous iteration images; generating a next iteration image by an image reconstruction model to reduce an objective function, the objective function corresponding to a data consistency metric and a regularization metric; evaluating whether the next iteration image is satisfactory; and if the next iteration image is satisfactory, outputting the next iteration image as an output image. In certain examples, the data consistency metric corresponds to a first previous iteration image, the k-space data, and the transform operator. In certain examples, the regularization metric corresponds to the distribution. In certain examples, the computer-implemented method is performed by one or more processors.

20 Claims, 4 Drawing Sheets

SYSTEMS AND METHODS FOR RECONSTRUCTING A MEDICAL IMAGE USING META LEARNING

1. BACKGROUND OF THE INVENTION

Certain embodiments of the present invention are directed to image reconstruction. More particularly, some embodiments of the invention provide methods and systems for reconstructing a medical image using meta learning. Merely by way of example, some embodiments of the invention are configured to reconstruct an MR image. But it would be recognized that the invention has a much broader range of applicability.

Slow data acquisition is a big challenge for Magnetic Resonance Imaging (MRI). To accelerate data acquisition, current systems often acquire only a fraction of the available MRI data, called k-space. In some practices, parallel imaging with multi-channel coils is also applied to further reduce scan time. The obtained k-space data, which is a complex valued matrix representing the frequency patterns from magnetic resonance, is then processed by imaging processing algorithms such as fast Fourier transform to generate the image data that can be visualized and interpreted by human users. This process is commonly referred to as image reconstruction and is still a problem that would benefit from a more efficient solution.

2. BRIEF SUMMARY OF THE INVENTION

Certain embodiments of the present invention are directed to image reconstruction. More particularly, some embodiments of the invention provide methods and systems for reconstructing a medical image using meta learning. Merely by way of example, some embodiments of the invention are configured to reconstruct an MR image. But it would be recognized that the invention has a much broader range of applicability.

In various embodiments, a computer-implemented method for reconstructing an image includes: receiving k-space data; receiving a transform operator corresponding to the k-space data; determining a distribution representing information associated with one or more previous iteration images; generating a next iteration image by an image reconstruction model to reduce an objective function, the objective function corresponding to a data consistency metric and a regularization metric; evaluating whether the next iteration image is satisfactory; and if the next iteration image is satisfactory, outputting the next iteration image as an output image. In certain examples, the data consistency metric corresponds to a first previous iteration image, the k-space data, and the transform operator. In certain examples, the regularization metric corresponds to the distribution.

In various embodiments, a system for reconstructing an image includes: a k-space data receiving module configured to receive k-space data; a transform operator receiving module configured to receive a transform operator corresponding to the k-space data; a distribution determining module configured to determine a distribution representing information associated with one or more previous iteration images; an image generating module configured to generate a next iteration image by an image reconstruction model to reduce an objective function, the objective function corresponding to a data consistency metric and a regularization metric; an evaluation module configured to evaluate whether the next iteration image is satisfactory; and an outputting module configured to, if the next iteration image is satisfactory, output the next iteration image as an output image. In certain examples, the data consistency metric corresponds to a first previous iteration image, the k-space data, and the transform operator. In certain examples, the regularization metric corresponds to the distribution.

In various embodiments, a non-transitory computer-readable medium with instructions stored thereon, that when executed by a processor, causes the processor to perform one or more processes including: receiving k-space data; receiving a transform operator corresponding to the k-space data; determining a distribution representing information associated with one or more previous iteration images; generating a next iteration image by an image reconstruction model to reduce an objective function, the objective function corresponding to a data consistency metric and a regularization metric; evaluating whether the next iteration image is satisfactory; and if the next iteration image is satisfactory, outputting the next iteration image as an output image. In certain examples, the data consistency metric corresponds to a first previous iteration image, the k-space data, and the transform operator. In certain examples, the regularization metric corresponds to the distribution.

Depending upon embodiment, one or more benefits may be achieved. These benefits and various additional objects, features and advantages of the present invention can be fully appreciated with reference to the detailed description and accompanying drawings that follow.

3. BRIEF DESCRIPTION OF THE DRAWINGS

4. DETAILED DESCRIPTION OF THE INVENTION

Certain embodiments of the present invention are directed to image reconstruction. More particularly, some embodiments of the invention provide methods and systems for reconstructing a medical image using meta learning. Merely by way of example, some embodiments of the invention are configured to reconstruct an MR image. But it would be recognized that the invention has a much broader range of applicability.

Figure 1:
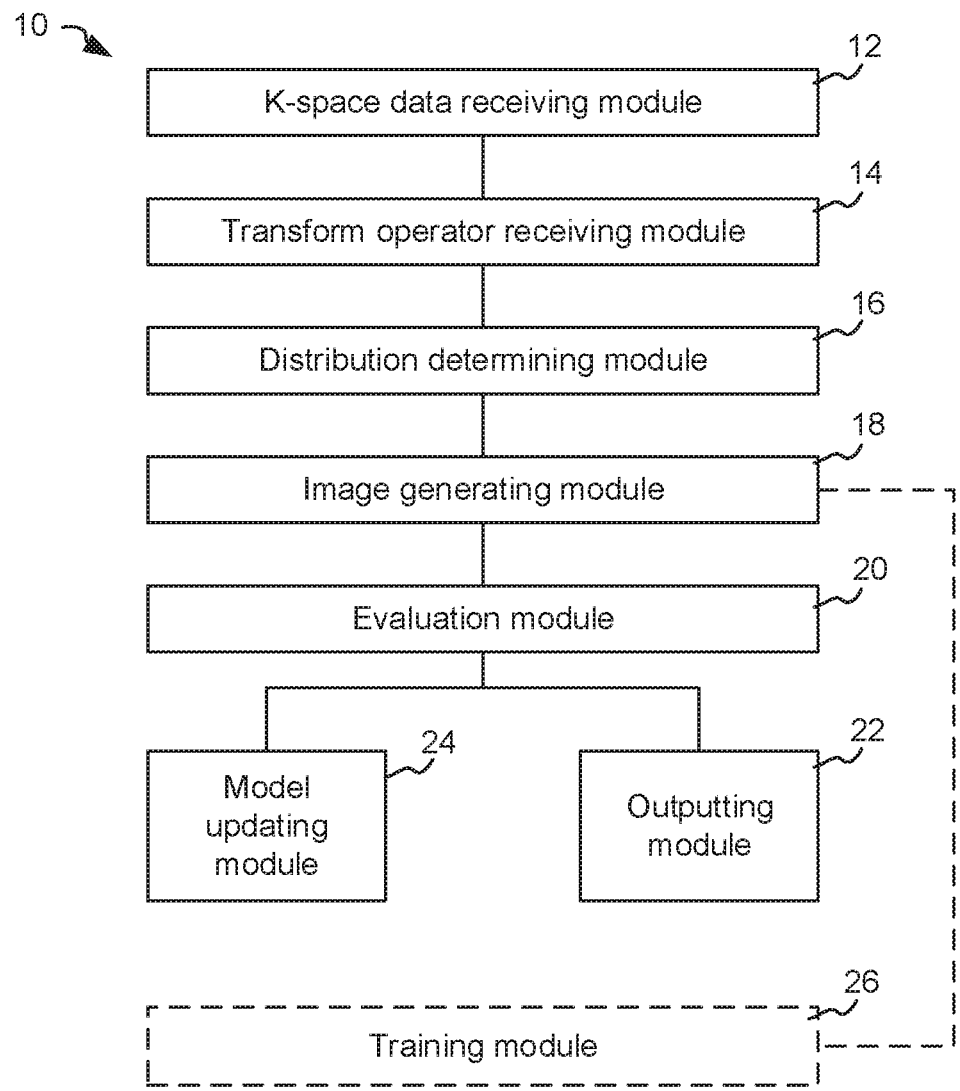
FIG. 1 is a simplified diagram showing a system for reconstructing an image, according to some embodiments.

FIG. 1 is a simplified diagram showing a system for reconstructing an image, according to some embodiments. This diagram is merely an example, which should not unduly limit the scope of the claims. One of ordinary skill in the art would recognize many variations, alternatives, and modifications. In some examples, the system 10 includes a k-space data receiving module 12, a transform operator receiving module 14, a distribution determining module 16, an image generating module 18, an evaluation module 20, an outputting module 22, and a model updating module 24. In certain examples, the system 10 further includes a training module 26. In certain examples, the system 10 is configured to implement method S100 of FIG. 2. Although the above has been shown using a selected group of components, there can be many alternatives, modifications, and variations. For example, some of the components may be expanded and/or combined. Some components may be removed. Other components may be inserted to those noted above. Depending upon the embodiment, the arrangement of components may be interchanged with others replaced.

In various embodiments, the k-space data receiving module 12 is configured to receive k-space data, such as to receive k-space data from a medical scanner (e.g., MR, CT, or PET scanner). In certain examples, the k-space data receiving module 12 is configured to receive undersampled k-space data. In certain examples, the k-space data receiving module 12 is configured to input the k-space data into an image reconstruction model.

In various embodiments, the transform operator receiving module 14 is configured to receive a transform operator, such as a transform operator corresponding to the k-space data. In certain examples, the transform operator includes a Fourier transform matrix, an undersampling matrix, and/or a coil sensitivity map matrix corresponding to a parallel imaging setup.

In various embodiments, the distribution determining module 16 is configured to determine a distribution representing information associated with one or more previous iteration images. In some examples, the distribution includes a distribution of sparsity representing the one or more previous iteration images. In some examples, the distribution includes a distribution of smoothness representing the one or more previous iteration images. In some examples the distribution is a normalized distribution having a mean of zero and a variance of unity. In some examples, the distribution determining module 16 is configured to normalize the information by transforming one or more information values. For example, transforming one or more information values includes transforming one or more information values deviating from a normal distribution into one or more transformed values conforming to a normal distribution. In some examples, the distribution is represented by a convolutional neural network configured to represent information associated with the one or more previous iteration images within one or more data consistency layers and one or more skip connections for residual learning.

In various embodiments, the image generating module 18 is configured to generate a next iteration image by an image reconstruction model to reduce an objective function and/or a loss corresponding to the objective function. In some examples, the objective function corresponds to a data consistency metric and a regularization metric. In certain examples, the data consistency metric corresponds to a first previous iteration image (e.g., a current iteration image), the k-space data, and the transform operator. In certain examples, the regularization metric corresponds to the distribution. In certain examples, the image generating module is configured to generate the next iteration image to minimize the objective function and/or the loss corresponding to the objective function. In some examples, the image reconstruction model uses a long short-term memory model configured to update one or more parameters of the convolutional neural network between iterations.

In various embodiments, the evaluation module 20 is configured to evaluate whether the next iteration image is satisfactory. In some examples, the evaluation module 20 is configured to evaluate the next iteration image by at least SSIM, PSNR, NMSE, and/or visual inspection.

In various embodiments, the outputting module 22 is configured to, if the next iteration image is satisfactory, output the next iteration image as an output image (e.g., to a display). In some examples, the outputting module 22 is configured to, if the next iteration image is not satisfactory, include the next iteration image into the one or more previous iteration images as the new first previous iteration image for the next iteration image reconstruction.

In various embodiments, the model updating module 24 is configured to update the image reconstruction model. In certain examples, the model updating module 24 is configured to update an input gate of the image reconstruction model based at least in part on the first previous iteration image, an input gate weight, and an input gate bias. In some examples, the input gate is configured to control which one or more new values associated with the one or more previous iteration images is incorporated into the next iteration image. In some examples, the input gate corresponds to a gradient direction and an iterative step size. In some examples, the updating the input gate includes updating at least the input gate weight and/or the input gate bias. In some examples, the model updating module 24 is configured to update the input gate by at least updating at least the input gate weight and/or the input gate bias.

In various examples, the model updating module 24 is configured to update a forget gate of the image reconstruction model based at least in part on the first previous iteration image, a forget gate weight, and a forget gate bias. In some examples, the forget gate is configured to control which one or more previous values associated with the first previous iteration image is incorporated into the next iteration image. In some examples, the forget gate corresponds to an initialization value. In some examples, the model updating module 24 is configured to update the forget gate by at least updating at least the forget gate weight and/or the forget gate bias.

In various embodiments, the training module 26 is configured to train the long short-term memory model, such as interactively, with training data.

Figure 2:
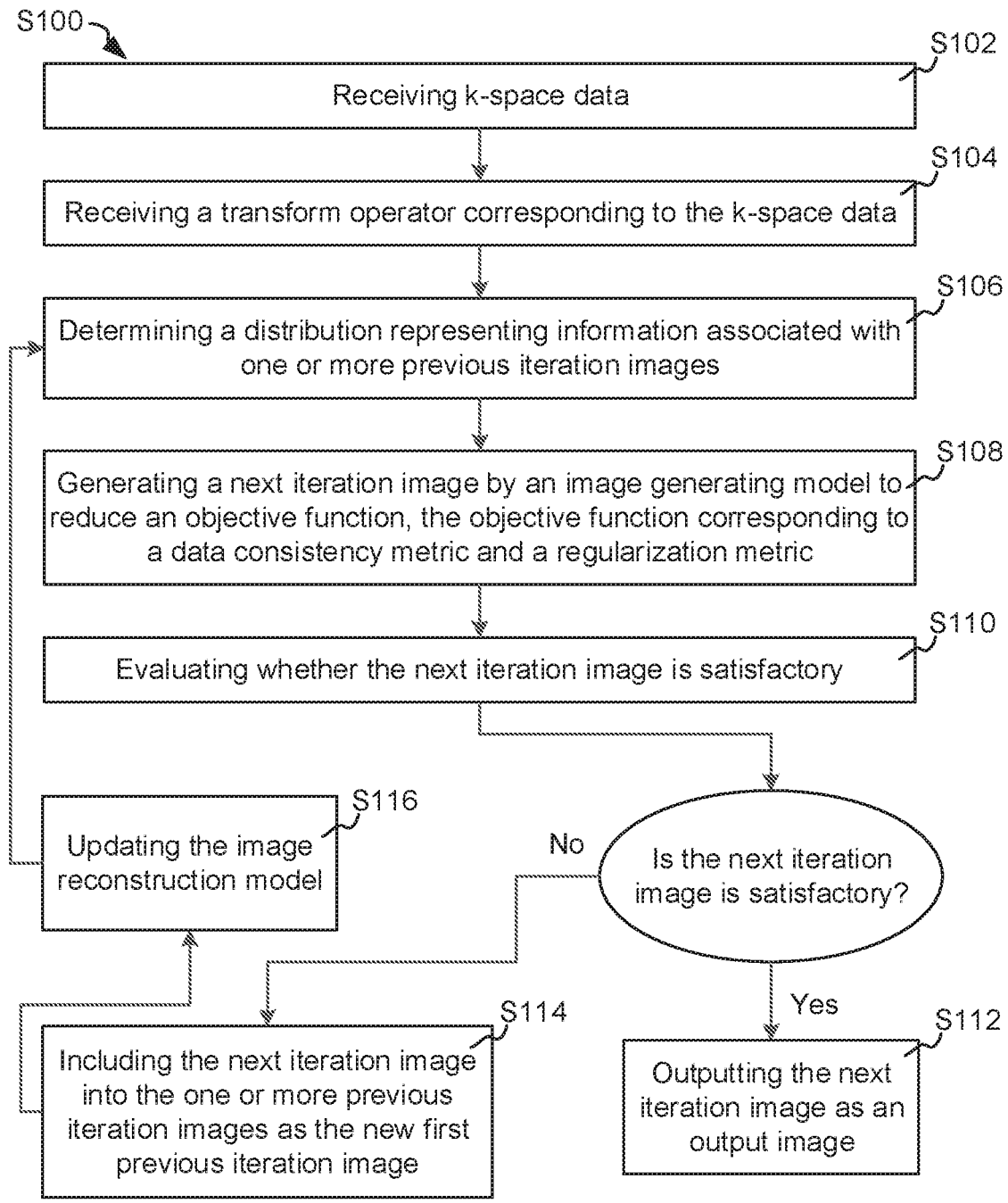
FIG. 2 is a simplified diagram showing a method for reconstructing an image, according to some embodiments.

FIG. 2 is a simplified diagram showing a method for reconstructing a medical image, according to some embodiments. This diagram is merely an example, which should not unduly limit the scope of the claims. One of ordinary skill in the art would recognize many variations, alternatives, and modifications. In certain examples, the method S100 is implemented by the system 10 of FIG. 1. In some examples, the method S100 includes a process S102 of receiving k-space data, a process S104 of receiving a transform operator, a process S106 of determining a distribution, a process S108 of generating a next iteration image, a process S110 of evaluating whether the next iteration image is satisfactory. In various examples, the method S100 further includes, if the next iteration image is satisfactory, a process S112 of outputting the next iteration image as an output image. In various examples, the method S100 further includes, if the next iteration image is not satisfactory, a process S114 of including the next iteration image into the one or more previous iteration images, and a process S116 of updating the image reconstruction model. Although the above has been shown using a selected group of processes for the method, there can be many alternatives, modifications, and variations. For example, some of the processes may be expanded and/or combined. Other processes may be inserted to those noted above. Some processes may be removed. Depending upon the embodiment, the sequence of processes may be interchanged with others replaced.

In various embodiments, the process S102 of receiving k-space data includes receiving k-space data from a medical scanner (e.g., MR, CT, or PET scanner). In certain examples, receiving k-space data includes receiving undersampled k-space data. In certain examples, receiving k-space data includes inputting the k-space data into an image reconstruction model. In some examples, the image reconstruction model includes an input gate and a forget gate.

In various embodiments, the process S104 of receiving a transform operator includes receiving a transform operator corresponding to the k-space data. In some examples, the transform operator includes a Fourier transform matrix, an undersampling matrix, and/or a coil sensitivity map matrix corresponding to a parallel imaging setup.

In various embodiments, the process S106 of determining a distribution includes determining a distribution representing information associated with one or more previous iteration images. In some examples, the distribution includes a distribution of sparsity representing the one or more previous iteration images. In some examples, the distribution includes a distribution of smoothness representing the one or more previous iteration images. In some examples, the distribution is a normalized distribution having a mean of zero and a variance of unity. In some examples, determining a distribution representing information associated with the one or more previous iteration images includes normalizing the information by transforming one or more information values. In some examples, the distribution is represented by a convolutional neural network configured to represent information associated with the one or more previous iteration images within one or more data consistency layers and one or more skip connections for residual learning.

In various embodiments, the process S108 of generating a next iteration image includes generating a next iteration image by an image reconstruction model to reduce an objective function and/or a loss corresponding to the objective function, the objective function corresponding to a data consistency metric and a regularization metric. In some examples, the generating a next iteration image to reduce an objective function includes generating the next iteration image to minimize the objective function and/or the loss.

In various embodiments, the process S110 of evaluating whether the next iteration image is satisfactory includes evaluating the next iteration image using at least SSIM, PSNR, NMSE, and/or visual inspection.

In some embodiments, if the next iteration image is satisfactory, the process S112 of outputting the next iteration image as an output image includes outputting the next iteration image as an output image to a display.

In some embodiments, if the next iteration image is not satisfactory, the process S114 of including the next iteration image into the one or more previous iteration images includes including the next iteration image into the one or more previous iteration images as the new first previous iteration image.

In various embodiments, the process S116 of updating the image reconstruction, such as being sub process of generating the next iteration image, includes updating the image reconstruction model by at least: updating the input gate based at least in part on the first previous iteration image, an input gate weight, and an input gate bias; and/or updating the forget gate based at least in part on the first previous iteration image, a forget gate weight, and a forget gate bias. In some examples, the input gate is configured to control which one or more new values associated with the one or more previous iteration images is incorporated into the next iteration image. In some examples, the forget gate is configured to control which one or more previous values associated with the first previous iteration image is incorporated into the next iteration image. In some examples, the input gate corresponds to a gradient direction and an iterative step size. In some examples, the forget gate corresponds to an initialization value. In some examples, the updating the input gate includes updating at least the input gate weight and/or the input gate bias. In some examples, the updating the forget gate includes updating at least the forget gate weight and/or the forget gate bias.

Figure 3:
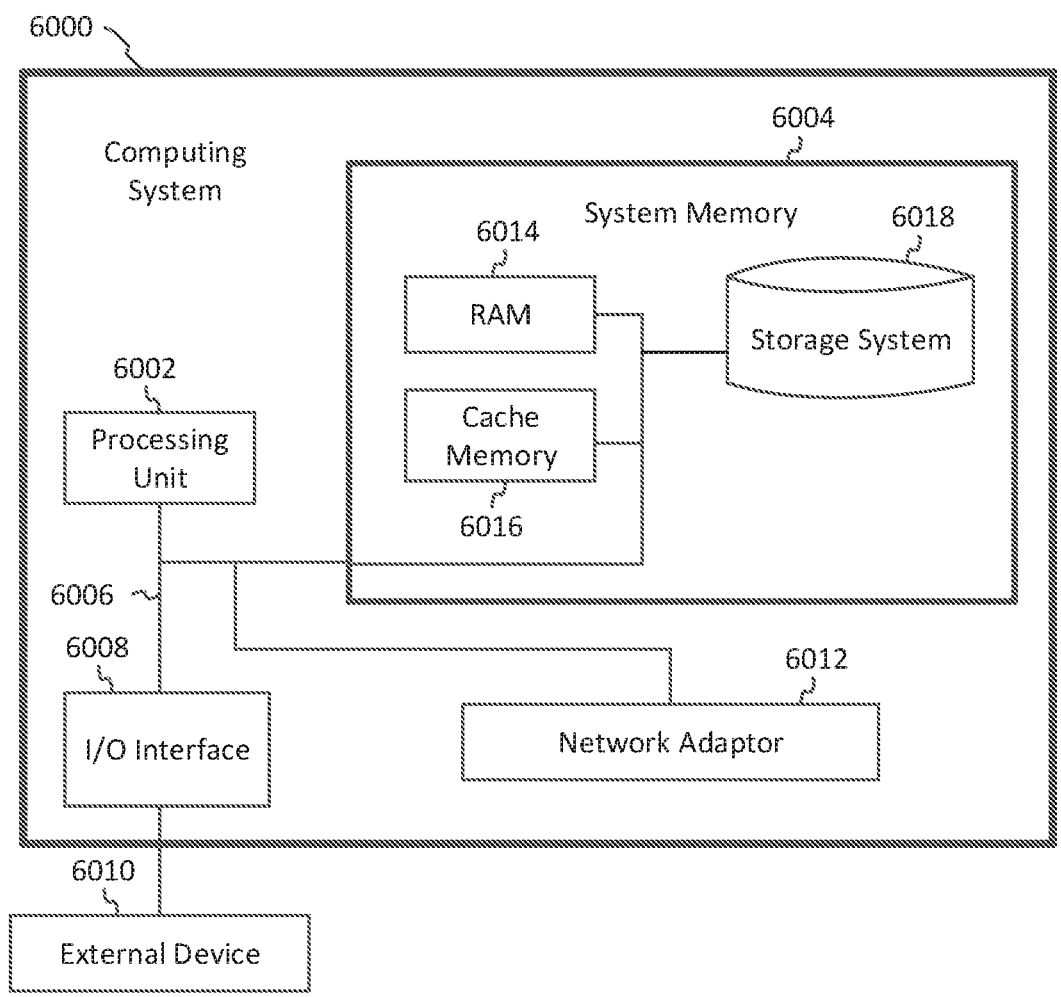
FIG. 3 is a simplified diagram showing a computing system, according to some embodiments.

FIG. 3 is a simplified diagram showing a computing system, according to some embodiments. This diagram is merely an example, which should not unduly limit the scope of the claims. One of ordinary skill in the art would recognize many variations, alternatives, and modifications. In certain examples, the computing system 6000 is a general-purpose computing device. In some examples, the computing system 6000 includes one or more processing units 6002 (e.g., one or more processors), one or more system memories 6004, one or more buses 6006, one or more input/output (I/O) interfaces 6008, and/or one or more network adapters 6012. In certain examples, the one or more buses 6006 connect various system components including, for example, the one or more system memories 6004, the one or more processing units 6002, the one or more input/output (I/O) interfaces 6008, and/or the one or more network adapters 6012. Although the above has been shown using a selected group of components for the computing system, there can be many alternatives, modifications, and variations. For example, some of the components may be expanded and/or combined. Other components may be inserted to those noted above. Some components may be removed. Depending upon the embodiment, the arrangement of components may be interchanged with others replaced.

In certain examples, the computing system 6000 is a computer (e.g., a server computer, a client computer), a smartphone, a tablet, or a wearable device. In some examples, some or all processes (e.g., steps) of the method S100 are performed by the computing system 6000. In certain examples, some or all processes (e.g., steps) of the method S100 are performed by the one or more processing units 6002 directed by one or more codes. For example, the one or more codes are stored in the one or more system memories 6004 (e.g., one or more non-transitory computer-readable media), and are readable by the computing system 6000 (e.g., readable by the one or more processing units 6002). In various examples, the one or more system memories 6004 include one or more computer-readable media in the form of volatile memory, such as a random-access memory (RAM) 6014, a cache memory 6016, and/or a storage system 6018 (e.g., a floppy disk, a CD-ROM, and/or a DVD-ROM).

In some examples, the one or more input/output (I/O) interfaces 6008 of the computing system 6000 is configured to be in communication with one or more external devices 6010 (e.g., a keyboard, a pointing device, and/or a display). In certain examples, the one or more network adapters 6012 of the computing system 6000 is configured to communicate with one or more networks (e.g., a local area network (LAN), a wide area network (WAN), and/or a public network (e.g., the Internet)). In various examples, additional hardware and/or software modules are utilized in connection with the computing system 6000, such as one or more micro-codes and/or one or more device drivers.

Figure 4:
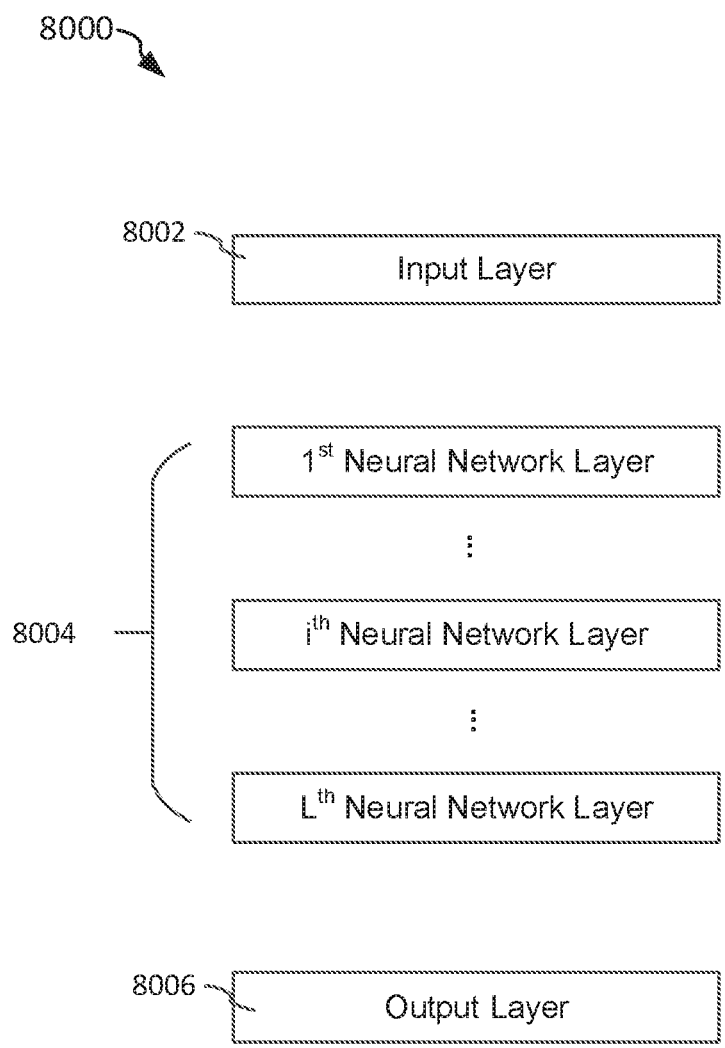
FIG. 4 is a simplified diagram showing a neural network, according to some embodiments.

FIG. 4 is a simplified diagram showing a neural network, according to some embodiments. For example, a neural network is utilized by one or more modules, such as by the distribution determining module and/or the image generating module. This diagram is merely an example, which should not unduly limit the scope of the claims. One of ordinary skill in the art would recognize many variations, alternatives, and modifications. The neural network 8000 is an artificial neural network. In some examples, the neural network 8000 includes an input layer 8002, one or more hidden layers 8004, and an output layer 8006. For example, the one or more hidden layers 8004 includes L number of neural network layers, which include a $1^{st}$ neural network layer, ..., an $i^{th}$ neural network layer, ... and an $L^{th}$ neural network layer, where L is a positive integer and i is an integer that is larger than or equal to 1 and smaller than or equal to L. Although the above has been shown using a selected group of components for the neural network, there can be many alternatives, modifications, and variations. For example, some of the components may be expanded and/or combined. Other components may be inserted to those noted above. Some components may be removed. Depending upon the embodiment, the arrangement of components may be interchanged with others replaced.

In some examples, some or all processes (e.g., steps) of the method S100 are performed by the neural network 8000 (e.g., using the computing system 6000). In certain examples, some or all processes (e.g., steps) of the method S100 are performed by the one or more processing units 6002 directed by one or more codes that implement the neural network 8000. For example, the one or more codes for the neural network 8000 are stored in the one or more system memories 6004 (e.g., one or more non-transitory computer-readable media), and are readable by the computing system 6000 such as by the one or more processing units 6002.

In certain examples, the neural network 8000 is a deep neural network (e.g., a convolutional neural network). In some examples, each neural network layer of the one or more hidden layers 8004 includes multiple sublayers. As an example, the $i^{th}$ neural network layer includes a convolutional layer, an activation layer, and a pooling layer. For example, the convolutional layer is configured to perform feature extraction on an input (e.g., received by the input layer or from a previous neural network layer), the activation layer is configured to apply a nonlinear activation function (e.g., a ReLU function) to the output of the convolutional layer, and the pooling layer is configured to compress (e.g., to down-sample, such as by performing max pooling or average pooling) the output of the activation layer. As an example, the output layer 8006 includes one or more fully connected layers.

As discussed above and further emphasized here, FIG. 4 is merely an example, which should not unduly limit the scope of the claims. One of ordinary skill in the art would recognize many variations, alternatives, and modifications. For example, the neural network 8000 is replaced by an algorithm that is not an artificial neural network. As an example, the neural network 8000 is replaced by a machine learning model that is not an artificial neural network.

In certain embodiments, a data acquisition process (e.g., a MRI data acquisition process) may be represented as Equation (1):

$$y=Fx+\epsilon, \quad (1)$$

where x represents an expected image, y represents an acquired (e.g., observed) k-space data, ε represents noise, and F represents a measurement operator that transforms an image into k-space data, which may include multiplications of coil sensitivity map matrix for parallel imaging, Fourier transform matrix, and/or undersampling matrix.

In certain embodiments, an image reconstruction process (e.g., a MRI image reconstruction process) includes solving an optimization problem, such as an optimization problem in relation to estimating image x from the acquired k-space data y. In certain examples, the optimization problem may be represented as an objective function, as shown in Equation (2):

$$\underset{x}{\mathrm{argmin}}\, \frac{1}{2}\|y-Fx\|_2^2, \quad (2)$$

where $\|y-Fx\|_2^2$ may be referred to as a data fidelity term or a data consistency metric.

In certain embodiments, a regularization function is introduced to the objective function shown in Equation (2) to improve stability, such as to help compensate for information loss in the forward process (e.g., image to k-space). For example, Equation (3) includes an objective function including a regularization function R(x) and a weight λ:

$$\underset{x}{\mathrm{argmin}}\, \frac{1}{2}\|y-Fx\|_2^2 + \lambda R(x), \quad (3)$$

In certain embodiments, such as from a Bayesian perspective, the regularization function represents a prior distribution over image x and/or a data corresponding to image x in a transformed space (e.g., a total variation domain). In certain examples, the prior distribution incorporates prior knowledge about one or more properties of image x, such as sparsity and/or smoothness of image x. In certain examples, the regularization function R(x) is learned from data. For example, the regularization function R(x) is represented by a neural network configured to learn the proper regularization.

In certain embodiments, solving an optimization as represented by the objective function shown in Equation (3), several algorithms may be used, such as gradient decent, proximal gradient descent, or primal-dual optimization. In certain examples, R(x) is differential for gradient decent to solve the optimization problem in an iterative manner. For example, in each iteration, the image obtaining process may be represented by Equation (4):

$$\hat{x}^{(k+1)} = \hat{x}^k + \alpha[F^T(y-F\hat{x}^k) + \nabla R(\hat{x}^k)], \quad (4)$$

where k is the iteration index and a is the learning rate.

In certain embodiments, image reconstructing in a non-iterative approach includes training one or more neural networks (e.g., of one or more network structure types) to learn direct mapping from a subsampled images to a full image. In certain examples, such as in alternative examples, training the one or more neural networks includes training the one or more neural networks to learn one or more residuals by adding one or more skip connection within each network. For example, one or more data consistency layers incorporating the data fidelity term is added into each network. In certain examples, the non-iteration image reconstruction performs just one iteration of the optimization process.

In certain embodiments, image reconstructing in an iterative approach includes cascading several neural networks together or using a recurrent neural network (RNN) to learn the iterative process, such as by repeating the one iteration the non-iteration image reconstructing process performs. In certain examples, an iteration image reconstruction performs multiple iterations to obtain a satisfactory reconstruction image.

In certain embodiments, systems and methods for reconstructing a medical image (e.g., a Mill image) includes using meta learning, such as using an image reconstruction model. In certain examples, the objective function corresponding to image reconstruction model may be represented by Equation (5):

$$L = \frac{1}{2}\|y - Fx\|_2^2 + \lambda R(x), \quad (5)$$

where the first term on the right is the data consistency term and the second term on the right is the regularization term. In certain examples, a neural network of the image reconstruction model is configured to perform as the regularization term, such itself may be a function.

In certain embodiments, such as during training of an image reconstruction model, a loss function is reduced (e.g., minimized). In certain examples, reducing (e.g., minimizing) the loss function corresponds to reducing (e.g., minimizing) the objective function, such as when the regularization term is incorporated into the image reconstruction model as a neural network. In certain examples, the image reconstruction model is configured to, during training, reduce the loss, such as to reduce the objective function, which corresponds to the data consistency metric and the regularization metric. In certain examples, the loss function is referred to as loss or deviation. In certain examples, the estimating of image x corresponds to minimizing the loss function and/or the objective function, which may be represented by Equation (6):

$$\hat{x} = \underset{x}{\operatorname{argmin}} L, \quad (6)$$

In certain embodiments, reconstructing an image (e.g., a MRI image) includes using a meta learner, such as a long short-term memory (LSTM) model including a forget gate and an input gate. In certain examples, the hidden state of the LSTM model is the image x to be reconstructed. The iteration image reconstruction process may be represented by Equation (7):

$$\hat{x}^{(k+1)} = f^k \odot \hat{x}^k + g^k \odot \frac{\partial L}{\partial x}, \quad (7)$$

$$= f^k \odot \hat{x}^k + g^k \odot G(\hat{x}^k), \quad (8)$$

$$f^k = \sigma(W_f \circledast [\hat{x}^k, f^{(k-1)}] + b_f), \quad (9)$$

$$g^k = \sigma(W_g \circledast [\hat{x}^k, g^{(k-1)}] + b_g). \quad (10)$$

where f represents the forget gate, g represents the input gate, L represents the loss function and/or the objective function, $x^k$ represents the first previous iteration image, and $x^{k+1}$ represents the next iteration image. In certain examples, the first previous iteration image is the latest iteration image reconstructed right before the next iteration image and may be referred to the current image. In certain examples, the image x is updated in each iteration, such as by updating the input gate and the forget gate in each iteration.

In certain examples, the input gate corresponds to a learning rate and the forget gate corresponds to a shrinkage factor and may correspond to a regularization term. In certain examples, the gradient term may be replaced by a CNN model $G(\hat{x}^k)$, as shown in Equation (8). In certain examples, the forget gate may be represented by $f^k$ as shown in Equation (9). In certain examples, a current iteration (e.g., the first previous iteration) forget gate value corresponds to a forget gate weight $W_f$, a forget gate bias $b_f$, a current iteration (e.g., the first previous iteration) reconstructed image a previous iteration (e.g., a second previous iteration) forget gate value $f^{k-1}$, and a non-linear operator a. In certain examples, the input gate may be represented by $g^k$ as shown in Equation (10). In certain examples, a current iteration (e.g., the first previous iteration) input gate value corresponds to an input gate weight $W_g$, an input gate bias $b_g$, a current iteration (e.g., the first previous iteration) reconstructed image a previous iteration (e.g., a second previous iteration) input gate value $g^{k-1}$, and a non-linear operator a.

In certain embodiments, reconstructing an image includes training the LSTM model with training data. In certain examples, the LSTM model is configured as a meta learner and learns an adaptive learning rate corresponding to the input gate $g^k$ and an adaptive regularizer corresponding to the forget gate $f^k$. In certain examples, the LSTM meta learner help improve efficiency in image reconstruction, which may be considered as an optimization problem.

In certain embodiments, the meta learner is configured to learn an efficient optimization algorithm to help solve the optimization problem of image reconstruction (e.g., for an MRI image). In certain examples, the meta learner is configured to help find a good initialization value of image x ($x^0$) such that the satisfactory reconstructed image may be found (e.g., optimized) in fewer iterations. In certain examples, the meta learner is configured to perform gradient decent efficiently such that the reconstructed image x between iterations improve more efficiently, and thus reducing the total number of iterations required to generate the satisfactory reconstructed image.

In certain examples, the meta learner is trained, such as with one interactive step (e.g., involving user input or guidance). In certain examples, the distribution corresponding to the one or more previous iteration images reconstructed before the next iteration image is represented by a CNN model with data consistency layer and skip connection within the model for residual learning. In certain examples, the meta learner is a LSTM model configured as an optimizer for learning parameter initialization (e.g., from the CNN model) and parameter updating, such as during one or more iterations, to help obtain a satisfactory reconstructed image. In certain examples, reconstructing an image includes evaluation each iteration image to determine which iteration image is satisfactory. For example, evaluating an iteration image includes, such as for images reconstructed from unseen test data (e.g., k-space data), using structural similarity (SSIM) index, peak signal-to-noise ratio (PSNR), mean-squared error (MSE), normalized mean-squared error (NMSE), and/or visual inspection.

In various embodiments, a computer-implemented method for reconstructing an image includes: receiving k-space data; receiving a transform operator corresponding to the k-space data; determining a distribution representing information associated with one or more previous iteration images; generating a next iteration image by an image reconstruction model to reduce an objective function, the objective function corresponding to a data consistency metric and a regularization metric; evaluating whether the next iteration image is satisfactory; and if the next iteration image is satisfactory, outputting the next iteration image as an output image. In certain examples, the data consistency metric corresponds to a first previous iteration image, the k-space data, and the transform operator. In certain examples, the regularization metric corresponds to the distribution. In certain examples, the computer-implemented method is performed by one or more processors. In some examples, the computer-implemented method is implemented at least partly according to the method S100 of FIG. 2. In certain examples, the method is implemented at least partly by the system 10 of FIG. 1.

In some embodiments, the image reconstruction model includes an input gate and a forget gate. In certain examples, the generating the next iteration image includes updating the image reconstruction model by at least: updating the input gate based at least in part on the first previous iteration image, an input gate weight, and an input gate bias; and/or updating the forget gate based at least in part on the first previous iteration image, a forget gate weight, and a forget gate bias.

In some embodiments, the input gate is configured to control which one or more new values associated with the one or more previous iteration images is incorporated into the next iteration image.

In some embodiments, the forget gate is configured to control which one or more previous values associated with the first previous iteration image is incorporated into the next iteration image.

In some embodiments, the input gate corresponds to a gradient direction and an iterative step size.

In some embodiments, the forget gate corresponds to an initialization value.

In some embodiments, the updating the input gate includes updating at least the input gate weight and/or the input gate bias.

In some embodiments, the updating the forget gate includes updating at least the forget gate weight and/or the forget gate bias.

In some embodiments, the generating a next iteration image to reduce an objective function includes generating the next iteration image to minimize the objective function.

In some embodiments, the distribution includes a distribution of sparsity representing the one or more previous iteration images.

In some embodiments, the distribution includes a distribution of smoothness representing the one or more previous iteration images.

In some embodiments, the distribution is a normalized distribution having a mean of zero and a variance of unity.

In some embodiments, determining a distribution representing information associated with the one or more previous iteration images includes normalizing the information by transforming one or more information values.

In some embodiments, the distribution is represented by a convolutional neural network configured to represent information associated with the one or more previous iteration images within one or more data consistency layers and one or more skip connections for residual learning.

In some embodiments, the image reconstruction model uses a long short-term memory model configured to update one or more parameters of the convolutional neural network between iterations.

In some embodiments, the computer-implemented method further includes training the long short-term memory model interactively with training data.

In some embodiments, evaluating the next iteration image includes evaluating the next iteration image using at least SSIM, PSNR, NMSE, and/or visual inspection.

In some embodiments, the transform operator includes a Fourier transform matrix, an undersampling matrix, and/or a coil sensitivity map matrix corresponding to a parallel imaging setup.

In various embodiments, a system for reconstructing an image includes: a k-space data receiving module configured to receive k-space data; a transform operator receiving module configured to receive a transform operator corresponding to the k-space data; a distribution determining module configured to determine a distribution representing information associated with one or more previous iteration images; an image generating module configured to generate a next iteration image by an image reconstruction model to reduce an objective function, the objective function corresponding to a data consistency metric and a regularization metric; an evaluation module configured to evaluate whether the next iteration image is satisfactory; and an outputting module configured to, if the next iteration image is satisfactory, output the next iteration image as an output image. In certain examples, the data consistency metric corresponds to a first previous iteration image, the k-space data, and the transform operator. In certain examples, the regularization metric corresponds to the distribution. In some examples, the system is implemented at least partly according to the system 10 of FIG. 1. In certain examples, the system is configured to perform, at least partly, the method S100 of FIG. 2.

In some embodiments, the system further includes a model updating module configured to update the image reconstruction model. In certain examples, the model updating module is configured to update an input gate of the image reconstruction model based at least in part on the first previous iteration image, an input gate weight, and an input gate bias. In certain examples, the model updating module is configured to update a forget gate of the image reconstruction model based at least in part on the first previous iteration image, a forget gate weight, and a forget gate bias.

In some embodiments, the input gate is configured to control which one or more new values associated with the one or more previous iteration images is incorporated into the next iteration image.

In some embodiments, the forget gate is configured to control which one or more previous values associated with the first previous iteration image is incorporated into the next iteration image.

In some embodiments, the input gate corresponds to a gradient direction and an iterative step size.

In some embodiments, the forget gate corresponds to an initialization value.

In some embodiments, the updating the input gate includes updating at least the input gate weight and/or the input gate bias.

In some embodiments, the model updating module is configured to update the input gate by at least updating at least the input gate weight and/or the input gate bias.

In some embodiments, the model updating module is configured to update the forget gate by at least updating at least the forget gate weight and/or the forget gate bias.

In some embodiments, the image generating module is configured to generate the next iteration image to minimize the objective function.

In some embodiments, the distribution includes a distribution of sparsity representing the one or more previous iteration images.

In some embodiments, the distribution includes a distribution of smoothness representing the one or more previous iteration images.

In some embodiments, the distribution is a normalized distribution having a mean of zero and a variance of unity.

In some embodiments, the distribution determining module is configured to normalize the information by transforming one or more information values.

In some embodiments, the distribution is represented by a convolutional neural network configured to represent information associated with the one or more previous iteration images within one or more data consistency layers and one or more skip connections for residual learning.

In some embodiments, the image reconstruction model uses a long short-term memory model configured to update one or more parameters of the convolutional neural network between iterations.

In some embodiments, the computer-implemented method further includes a training module configured to train the long short-term memory model interactively with training data.

In some embodiments, the evaluation module is configured to evaluate the next iteration using at least SSIM, PSNR, NMSE, and/or visual inspection.

In some embodiments, the transform operator includes a Fourier transform matrix, an undersampling matrix, and/or a coil sensitivity map matrix corresponding to a parallel imaging setup.

In various embodiments, a non-transitory computer-readable medium with instructions stored thereon, that when executed by a processor, causes the processor to perform one or more processes including: receiving k-space data; receiving a transform operator corresponding to the k-space data; determining a distribution representing information associated with one or more previous iteration images; generating a next iteration image by an image reconstruction model to reduce an objective function, the objective function corresponding to a data consistency metric and a regularization metric; evaluating whether the next iteration image is satisfactory; and if the next iteration image is satisfactory, outputting the next iteration image as an output image. In certain examples, the data consistency metric corresponds to a first previous iteration image, the k-space data, and the transform operator. In certain examples, the regularization metric corresponds to the distribution. In some examples, the non-transitory computer-readable medium with instructions stored thereon is implemented according to the method S100 of FIG. 2. In certain examples, the non-transitory computer-readable medium with instructions stored thereon is configured to be implemented at least partly by system 10 (e.g., a terminal) of FIG. 1.

In some embodiments, the image reconstruction model includes an input gate and a forget gate. In certain examples, the generating the next iteration image includes updating the image reconstruction model by at least: updating the input gate based at least in part on the first previous iteration image, an input gate weight, and an input gate bias; and/or updating the forget gate based at least in part on the first previous iteration image, a forget gate weight, and a forget gate bias.

In some embodiments, the input gate is configured to control which one or more new values associated with the one or more previous iteration images is incorporated into the next iteration image.

In some embodiments, the forget gate is configured to control which one or more previous values associated with the first previous iteration image is incorporated into the next iteration image.

In some embodiments, the input gate corresponds to a gradient direction and an iterative step size.

In some embodiments, the forget gate corresponds to an initialization value.

In some embodiments, the updating the input gate includes updating at least the input gate weight and/or the input gate bias.

In some embodiments, the non-transitory computer-readable medium with instructions stored thereon, that when executed by a processor, further causes the processor to perform one or more processes including: updating at least the input gate weight and/or the input gate bias.

In some embodiments, the non-transitory computer-readable medium with instructions stored thereon, that when executed by a processor, further causes the processor to perform one or more processes including: updating at least the forget gate weight and/or the forget gate bias.

In some embodiments, the non-transitory computer-readable medium with instructions stored thereon, that when executed by a processor, further causes the processor to perform one or more processes including: generating the next iteration image to minimize the objective function.

In some embodiments, the distribution includes a distribution of sparsity representing the one or more previous iteration images.

In some embodiments, the distribution includes a distribution of smoothness representing the one or more previous iteration images.

In some embodiments, the distribution is a normalized distribution having a mean of zero and a variance of unity.

In some embodiments, the non-transitory computer-readable medium with instructions stored thereon, that when executed by a processor, further causes the processor to perform one or more processes including: normalizing the information by transforming one or more information values.

In some embodiments, the distribution is represented by a convolutional neural network configured to represent information associated with the one or more previous iteration images within one or more data consistency layers and one or more skip connections for residual learning.

In some embodiments, the image reconstruction model uses a long short-term memory model configured to update one or more parameters of the convolutional neural network between iterations.

In some embodiments, the non-transitory computer-readable medium with instructions stored thereon, that when executed by a processor, further causes the processor to perform one or more processes including: training the long short-term memory model interactively with training data.

In some embodiments, the non-transitory computer-readable medium with instructions stored thereon, that when executed by a processor, further causes the processor to perform one or more processes including: evaluating the next iteration image using at least SSIM, PSNR, NMSE, and/or visual inspection.

In some embodiments, the transform operator includes a Fourier transform matrix, an undersampling matrix, and/or a coil sensitivity map matrix corresponding to a parallel imaging setup.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, while the embodiments described above refer to particular features, the scope of the present invention also includes embodiments having different combinations of features and embodiments that do not include all of the described features. In yet another example, various embodiments and/or examples of the present invention can be combined.

Additionally, the methods and systems described herein may be implemented on many different types of processing devices by program code including program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to perform the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, EEPROM, Flash memory, flat files, databases, programming data structures, programming variables, IF-THEN (or similar type) statement constructs, application programming interface, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, DVD, etc.) that contain instructions (e.g., software) for use in execution by a processor to perform the methods' operations and implement the systems described herein. The computer components, software modules, functions, data stores and data structures described herein may be connected directly or indirectly to each other in order to allow the flow of data needed for their operations. It is also noted that a module or processor includes a unit of code that performs a software operation and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include client devices and servers. A client device and server are generally remote from each other and typically interact through a communication network. The relationship of client device and server arises by virtue of computer programs running on the respective computers and having a client device-server relationship to each other.

This specification contains many specifics for particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be removed from the combination, and a combination may, for example, be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. A computer-implemented method for reconstructing an image, the method comprising:
    receiving k-space data;
    receiving a transform operator corresponding to the k-space data;
    determining a distribution representing information associated with one or more previous iteration images;
    generating a next iteration image by an image reconstruction model to reduce an objective function, the objective function corresponding to a data consistency metric and a regularization metric;
    evaluating whether the next iteration image is satisfactory; and
    if the next iteration image is satisfactory, outputting the next iteration image as an output image;
    wherein the data consistency metric corresponds to a first previous iteration image, the k-space data, and the transform operator; and
    wherein the regularization metric corresponds to the distribution.

2. The computer-implemented method of claim 1,
    wherein the image reconstruction model includes an input gate and a forget gate; and
    wherein the generating the next iteration image includes updating the image reconstruction model by at least:
        updating the input gate based at least in part on the first previous iteration image, an input gate weight, and an input gate bias; and
        updating the forget gate based at least in part on the first previous iteration image, a forget gate weight, and a forget gate bias.

3. The computer-implemented method of claim 2, wherein the input gate is configured to control which one or more new values associated with the one or more previous iteration images is incorporated into the next iteration image.

4. The computer-implemented method of claim 2, wherein the forget gate is configured to control which one or more previous values associated with the first previous iteration image is incorporated into the next iteration image.

5. The computer-implemented method of claim 2, wherein the input gate corresponds to a gradient direction and an iterative step size.

6. The computer-implemented method of claim 2, wherein the forget gate corresponds to an initialization value.

7. The computer-implemented method of claim 2, wherein the updating the input gate includes updating at least one of the input gate weight and the input gate bias.

8. The computer-implemented method of claim 2, wherein the updating the forget gate includes updating at least one of the forget gate weight and the forget gate bias.

9. The computer-implemented method of claim 1, wherein the generating a next iteration image to reduce an objective function includes generating the next iteration image to minimize the objective function.

10. The computer-implemented method of claim 1, wherein the distribution includes a distribution of sparsity representing the one or more previous iteration images.

11. The computer-implemented method of claim 1, wherein the distribution includes a distribution of smoothness representing the one or more previous iteration images.

12. The computer-implemented method of claim 1, wherein the distribution is a normalized distribution having a mean of zero and a variance of unity.

13. The computer-implemented method of claim 1, wherein the determining a distribution representing information associated with the one or more previous iteration images includes normalizing the information by transforming one or more information values.

14. The computer-implemented method of claim 1, wherein the distribution is represented by a convolutional neural network configured to represent information associated with the one or more previous iteration images within one or more data consistency layers and one or more skip connections for residual learning.

15. The computer-implemented method of claim 14, wherein the image reconstruction model uses a long short-term memory model configured to update one or more parameters of the convolutional neural network between iterations.

16. The computer-implemented method of claim 15, further comprising training the long short-term memory model interactively with training data.

17. The computer-implemented method of claim 1, wherein evaluating the next iteration image includes evaluating the next iteration image using at least one of SSIM, PSNR, NMSE, and visual inspection.

18. The computer-implemented method of claim 1, wherein the transform operator includes one of a Fourier transform matrix, an undersampling matrix, and a coil sensitivity map matrix corresponding to a parallel imaging setup.

19. A system for reconstructing an image, the system comprising:
 a k-space data receiving module configured to receive k-space data;
 a transform operator receiving module configured to receive a transform operator corresponding to the k-space data;
 a distribution determining module implemented by the or more processors and configured to determine a distribution representing information associated with one or more previous iteration images;
 an image generating module implemented by the one or more processors and configured to generate a next iteration image by an image reconstruction model to reduce an objective function, the objective function corresponding to a data consistency metric and a regularization metric;
 an evaluation module implemented by the one or more processors and configured to evaluate whether the next iteration image is satisfactory; and
 an outputting module configured to, if the next iteration image is satisfactory, output the next iteration image as an output image;
 wherein the data consistency metric corresponds to a first previous iteration image, the k-space data, and the transform operator; and
 wherein the regularization metric corresponds to the distribution.

20. A non-transitory computer-readable medium with instructions stored thereon, that when executed by a processor, causes the processor to perform the processes including:
 receiving k-space data;
 receiving a transform operator corresponding to the k-space data;
 determining a distribution representing information associated with one or more previous iteration images;
 generating a next iteration image by an image reconstruction model to reduce an objective function, the objective function corresponding to a data consistency metric and a regularization metric;
 evaluating whether the next iteration image is satisfactory; and
 if the next iteration image is satisfactory, outputting the next iteration image as an output image;
 wherein the data consistency metric corresponds to a first previous iteration image, the k-space data, and the transform operator; and
 wherein the regularization metric corresponds to the distribution.

* * * * *